Sept. 20, 1971 J. C. W. BAKERMANS 3,605,237

APPLICATOR FOR MOUNTING WIRE WRAP PINS ON CIRCUIT BOARDS

Filed Aug. 25, 1969 7 Sheets-Sheet 1

INVENTOR.

Johannes C. W. Bakermans

BY [illegible]

ATTORNEYS

INVENTOR.
Johannes C. W. Bakermans
BY Whittemore,
Hulbert & Belknap
ATTORNEYS

APPLICATOR FOR MOUNTING WIRE WRAP PINS ON CIRCUIT BOARDS

Filed Aug. 25, 1969 7 Sheets-Sheet 3

INVENTOR.

Johannes C. W. Bakermans

BY Whittemore, Hulbert & Belknap

ATTORNEYS

APPLICATOR FOR MOUNTING WIRE WRAP PINS ON CIRCUIT BOARDS

Filed Aug. 25, 1969 7 Sheets-Sheet 4

INVENTOR.
Johannes C. W. Bakermans
BY Whittemore, Hulbert & Belknap
ATTORNEYS

INVENTOR.
Johannes C. W. Bakermans
BY Whittemore, Hulbert + Belknap
ATTORNEYS

INVENTOR.
Johannes C. W. Bakermans
BY Whittemore, Hulbert + Belknap
ATTORNEYS.

INVENTOR.
Johannes C. W. Bakermans
BY Whittemore,
Hulbert & Belknap
ATTORNEYS

United States Patent Office 3,605,237

Patented Sept. 20, 1971

3,605,237

APPLICATOR FOR MOUNTING WIRE WRAP PINS ON CIRCUIT BOARDS

Johannes C. W. Bakermans, Etters, Pa., assignor to Berg Electronics, Inc., New Cumberland, Pa.

Filed Aug. 25, 1969, Ser. No. 862,591
Int. Cl. H01r 43/04
U.S. Cl. 29—203D 13 Claims

ABSTRACT OF THE DISCLOSURE

Apparatus for mounting a pin on a circuit board in which the pin is fed to a position in approximate alignment with a punch, following which the pin is aligned accurately with the punch by a pair of clamps and the punch is moved toward the pin to pick up the pin. The clamps open and further movement of the punch secures the pin to the circuit board.

The invention relates to an apparatus and method for mounting contact pins to circuit boards or other substrates. The contact pins of the type referred to are relatively long and thin. The pins may have a round or square cross section which conventionally has a diameter of about 0.025 inch. Because the pins are easily bent and are so small, it is quite difficult to secure them to circuit boards rapidly in the desired precise locations required by today's technology. For example, in some applications it is necessary to secure as many as 342 contact pins in precise location on cross points of a grid on a 3 x 4 inch circuit board.

Conventionally contact pins have been secured to circuit boards manually through the use of a hand held tool. With the use of such tools it is difficult, if not impossible, to mount all of the pins on a single board reliably with each pin perpendicular to the board. Manual loading of the pins in the tool proves time consuming and difficult because of the size of the pins.

In the invention disclosed herein a carrier strip on which circuit board pins are spaced at regular intervals is indexed to position the lead pin between a pair of clamps and in approximate axial alignment with a long, thin punch. The carrier strip feed track extends from a feed mechanism to one of the clamps. A pivoted portion of the feed track connects the fixed portion of the track with the movable clamp portion so that the strip is moved as the clamp moves. After the pin has been positioned between the clamps, the punch lowers and the clamps close to engage the pin and hold it in exact axial alignment with the punch. The punch then moves toward the pin to engage the pin and the clamps are opened to permit further movement of the punch to mount the pin on the circuit board in the desired location.

The diameter of the punch may be small enough to mount pins on a circuit board grid having 0.15 inch spacing between adjacent pins. By clamping the pin in accurate axial alignment with the punch it is possible to reduce the size of the punch, thereby permitting close spacing of circuit board pins on a board.

In the apparatus disclosed the operation of the pin clamps is controlled by a pair of cams which move with the punch. As the punch is lowered the cams are swept past followers on lever arms to close and open clamps on each side of the lead circuit board pin. As the punch is moved toward the pin the followers move up rise surfaces on the cams to cause the clamps to close and orient the pin in precise alignment with the punch. After the punch has lowered sufficiently to engage the pin, the cam follower for the clamp which does not form part of the feed track falls off its respective cam to move the clamp away from the confined pin. Further lowering of the punch severs the connection between the pin and the carrier strip in the feed track, following which the other follower falls off its cam to retract the other clamp and the carrier strip carried by the clamp. With the retraction of both clamps out of the path of the punch, the punch is extended further to secure the confined pin to the circuit board.

In an applicator of the type described, the circuit board pin is accurately aligned relative to the punch, picked up by the punch, removed from the carrier strip, and secured to the circuit board during a single downward stroke of the punch. Performing all of these functions as the punch moves from the retracted to the fully extended position permits the applicator to attach pins to a circuit board at a high rate of speed. The operations of orienting, severing, releasing, and staking the pin are all tied to the motion of the punch so that it is not possible for these steps to be performed out of sequence, and jamming is reduced.

Other objects and features of the invention will become apparent as the description proceeds, especially when taken in conjunction with the accompanying drawings illustrating a preferred embodiment of the invention, wherein:

FIG. 5 is a top view illustrating part of the terminal feed mechanism;

DESCRIPTION OF THE APPARATUS

Figure 1:
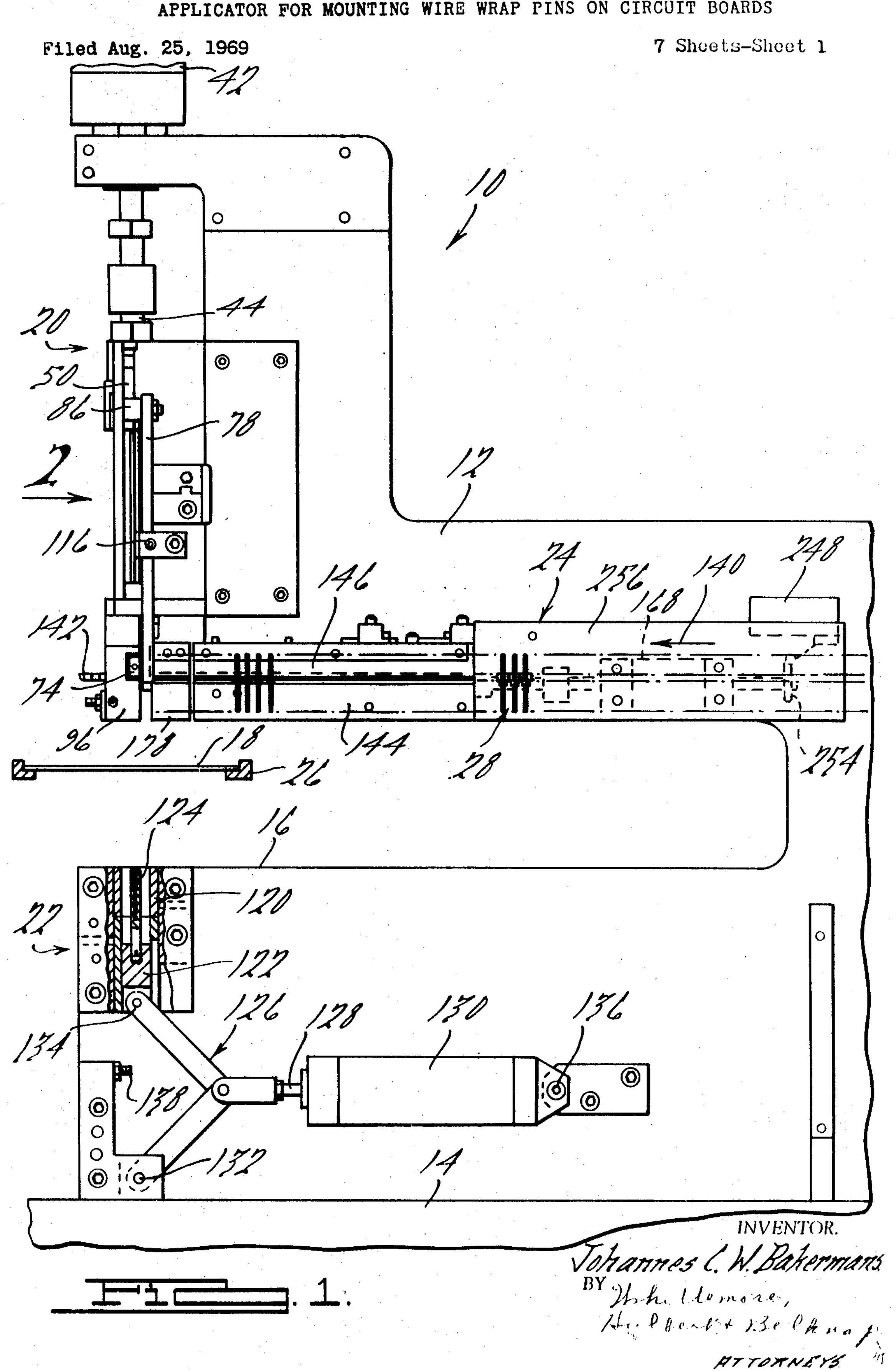
FIG. 1 is a side view of the apparatus for mounting pins on a circuit board.

Apparatus 10 includes a mounting plate 12 which extends upwardly from a base 14. A horizontally extending circuit board slot 16 is formed in one edge of the plate 12 to enable positioning of a circuit board 18 between punch assembly 20 and anvil assembly 22. An incremental pin feed 24 feeds the lead pin of a strip of pins illustrated in FIGS. 9 and 10 to a cut-off position located within the punch assembly so that upon actuation of the punch and anvil assemblies, the pin is secured to the circuit board 18 in a hole in the board aligned between the two assemblies. Circuit board 18 is positioned within slot 16 on movable support 26.

Figure 9:
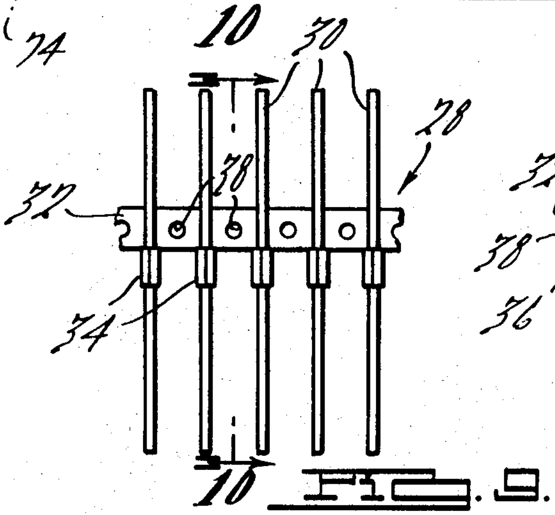
FIG. 9 is a side view of a strip of wire wrap pins which are applied to circuit boards by the apparatus described herein.
Figure 10:
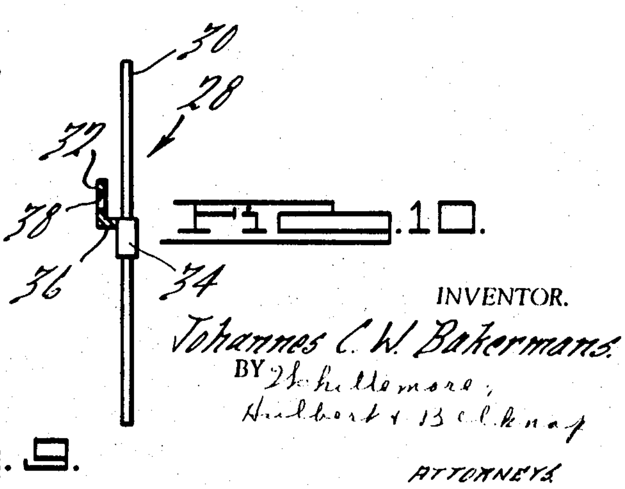
FIG. 10 is a sectional view taken along line 10—10 of FIG. 9.

FIGS. 9 and 10 illustrate a continuous strip 28 of square circuit board pins 30. The pins 30 may be 0.025 inch square and may be plated in order to improve their conductive properties. The length of the pins is determined by the particular application of the circuit board to which they are attached. A metal carrier strip 32 extends along the length of strip 28 and includes a number of regularly spaced pin-holding ferrules 34. The ferrules extend around pins 30 and are aligned transversely to the longitudinal axis of the strip 32 so that the pins extend in a direction generally perpendicular to the strip. As illustrated in FIG. 10, the ferrules 34 are offset laterally from the strip 32 by a connecting portion 36 so that the pins do not engage strip 32. Pilot holes 38 are provided at regular intervals in strip 32 to facilitate feeding of the strip.

Figures 2, 15:
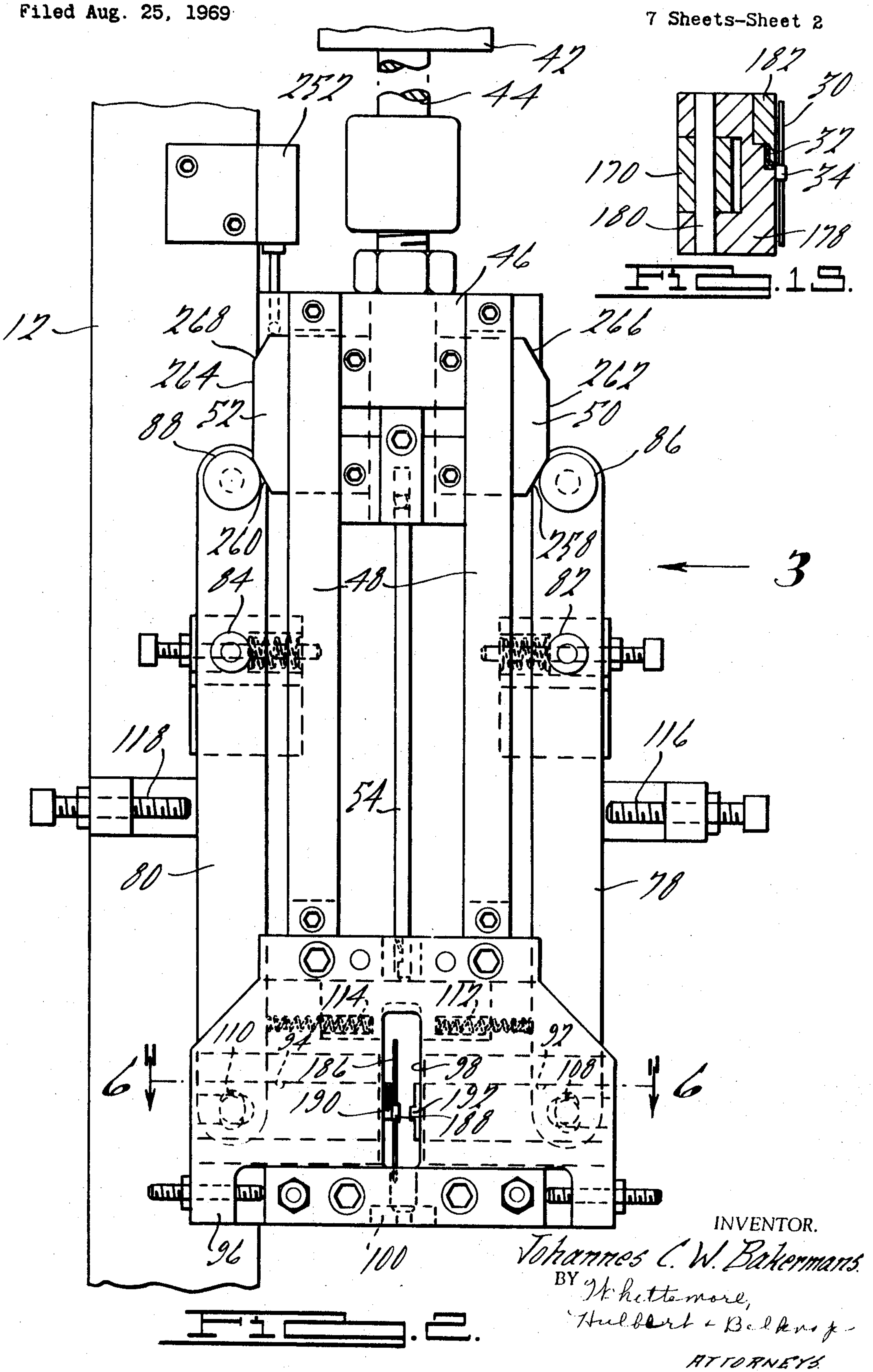
FIG. 2 is a front view of the apparatus, taken looking in the direction of arrow 2 in FIG. 1.
FIG. 15 is a sectional view taken along line 15—15 of FIG. 5.
Figures 3, 4:
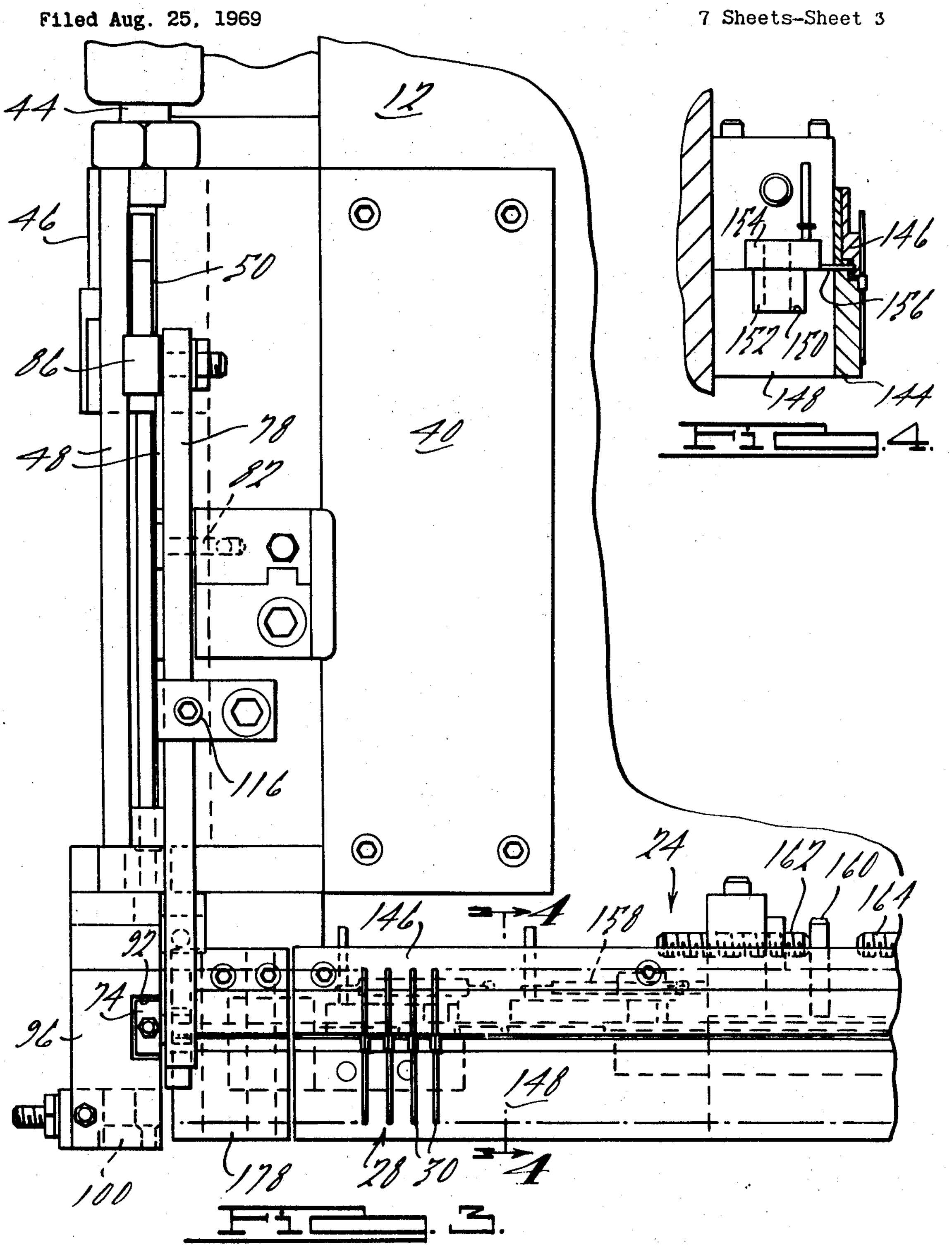
FIG. 3 is an enlarged partial side view of the apparatus, looking in the direction of arrow 3 of FIG. 2.
FIG. 4 is a sectional view taken along line 4—4 of FIG. 3, illustrating the terminal feed.

The punch assembly 20, illustrated in FIGS. 2 and 3, is mounted on plate 12 by means of a block 40 which offsets the assembly to the right and in front of plate 12 as viewed in FIG. 2. Ram air cylinder 42 is mounted on plate 12 as indicated in FIG. 1 above assembly 20. The piston rod 44 of cylinder 42 is secured to ram block 46 which is slidably confined between pairs of vertically extending guides 48. As illustrated in FIG. 2, the cylinder 42 is retracted and block 46 is in the up position.

Figures 12, 13, 14:
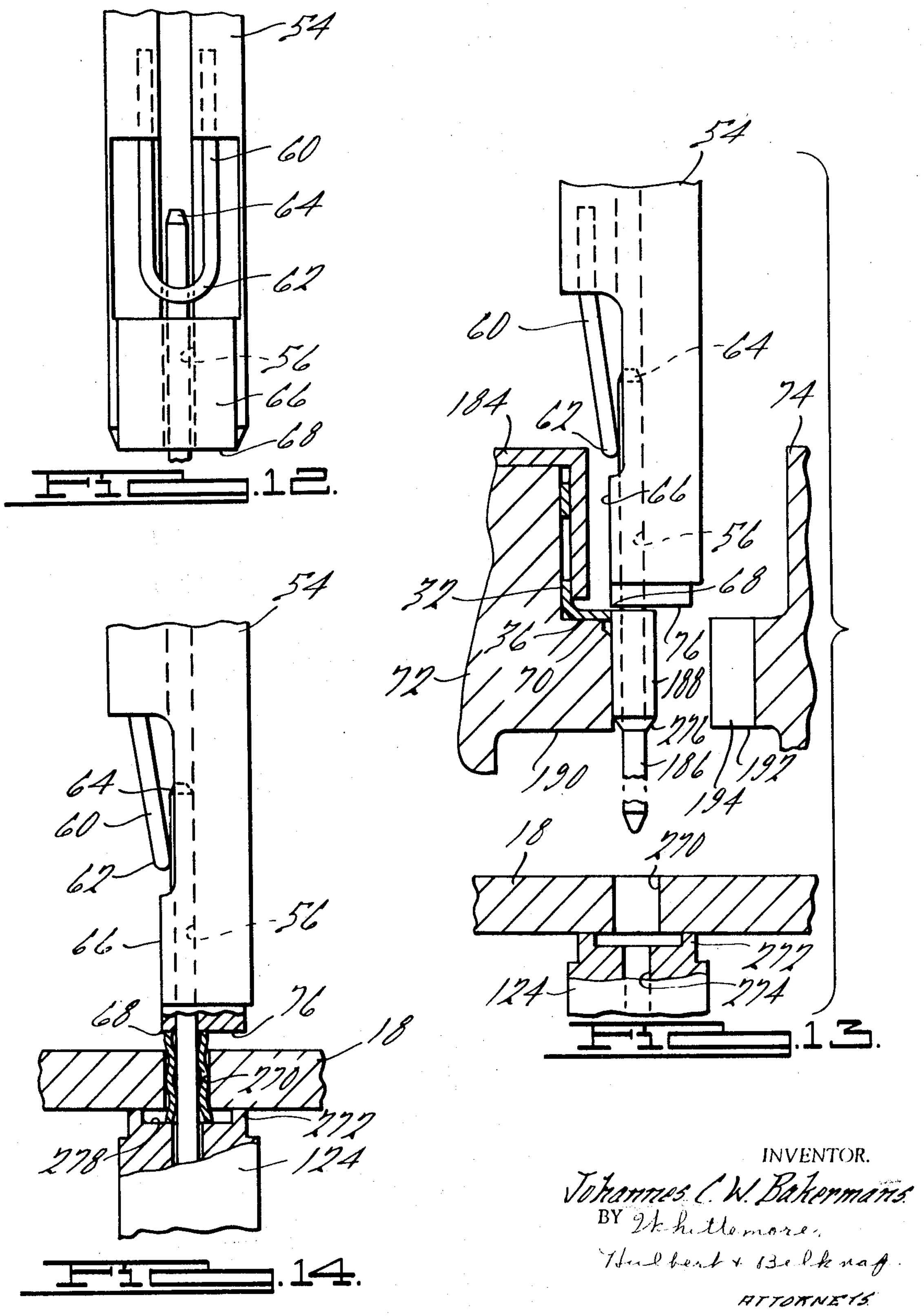
FIG. 12 is a side elevational view of the punch holding a wire wrap pin.
FIGS. 13 and 14 illustrate, respectively, severing of the pin from the carrier strip, and staking of the pin onto the circuit board.

A pair of cams 50 and 52 are mounted on block 46 and extend from the block through the guides 48 as illustrated in FIG. 2. A long rod-like punch 54 is carried by block 46 and extends from the block downwardly in alignment with the longitudinal axis of piston rod 44. As illustrated in FIGS. 12, 13 and 14, the lower end of the punch 54 is provided with a square pin receiving recess 56 which extends upwardly from the bottom of the punch past U-shaped spring 60. Adjacent the spring 60 the recess is open and has a depth slightly less than the side dimension of a pin. The spring 60 is mounted in punch 54 and as illustrated in FIGS. 12 and 13, with the bight portion 62 normally biased against the edges of the recess 56. When the punch 54 lowers over a pin, the pin fits into the recess and the tapered upper end 64 engages bight 62 and forces the spring away from the punch so that the spring confines the pin in the recess.

Flat 66 located at the lower end of punch 54 facing to the left as shown in FIG. 13 defines a punch cutting edge 68 at the bottom of the punch. Edge 68 cooperates with cutting edge 70 on slide 72 to sever the lead pin and ferrule from strip 32 at the junction between connecting portion 36 and the ferrule when the punch is lowered from the position illustrated in FIG. 13. A slide or jaw 72 is located to the left of the head pin and ferrule, as shown in FIG. 13, and a second slide or jaw 74 is located to the right of the pin and ferrule. The flat bottom surface 76 of punch 54 engages the top of the ferrule on the lead pin when the ferrule is severed from the strip.

Slide arms 78 and 80 are pivotally mounted on block 40 by means of adjustable bearings 82 and 84. Rollers or cam followers 86 and 88 on the upper ends of arms 78 and 80 respectively engage cams 50 and 52 as ram block 46 is moved by air cylinder 42.

Figure 6:
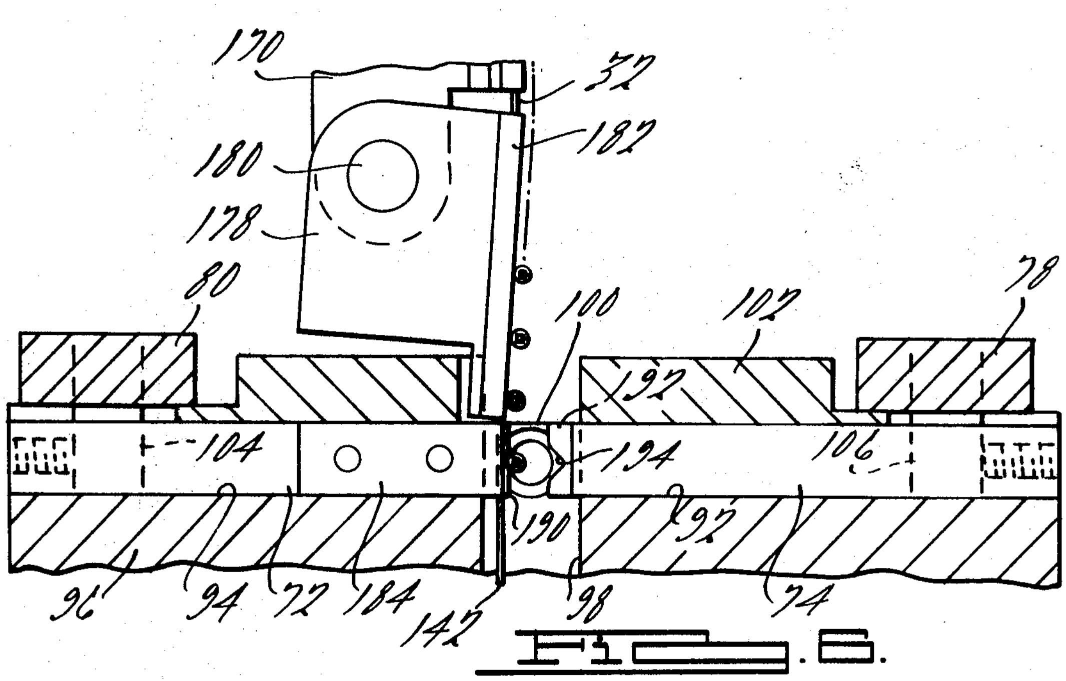
FIG. 6 is an enlarged sectional view taken along line 6—6 of FIG. 2, illustrating the clamping jaws in the open position.
Figure 11:
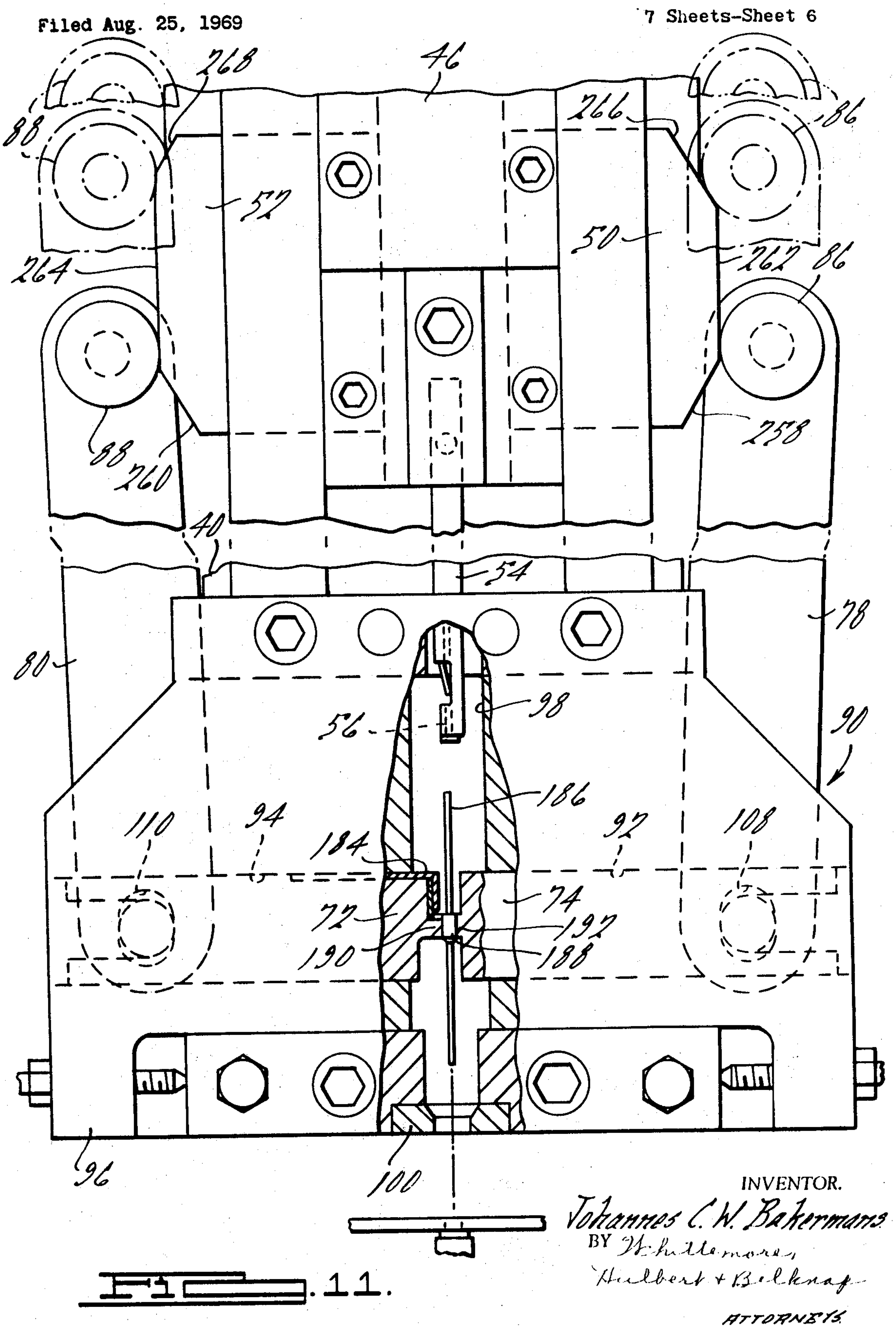
FIG. 11 is an enlarged partially broken away front view of the apparatus, illustrating lowering of the punch.

Assembly 20 includes a slide subassembly 90 located at the lower ends of guides 48 as illustrated in FIG. 11. Slides or jaws 72 and 74 are confined in recesses 92 and 94 formed in the back face of plate 96. As indicated in FIG. 6, a centrally located opening 98 is formed in plate 96 to permit downward movement of the punch 54. When cylinder 42 is fully extended, the lower end of the punch extends from the bottom of subassembly 90 through punch support 100. The support is adjustably mounted in plate 96 and has a close sliding clearance with the punch. Thus when air cylinder 42 is extended during staking of the pin and ferrule to the circuit board, the support aids in holding the punch in accurate location relative to the circuit board and the extended anvil.

Slide cover plate 102 is mounted on the back face of plate 96 to confine slides 72 and 74 within recesses 92 and 94. Pins 104 and 106 are mounted in the outer ends of slides 72 and 74 and project away from plate 96. The pins are each seated in elongated slots 108 and 110 in the lower ends of arms 78 and 80 respectively so that rotation of the arms in bearings 82 and 84 moves the slides 72 and 74 between the open position illustrated in FIG. 6 and the closed position illustrated in FIG. 11.

Springs 112 and 114 which are confined in subassembly 90 engage the lower ends of arms 78 and 80 so as to spread the arms and maintain rollers 86 and 88 in engagement with either cams 50 and 52 or the arms in engagement with stops 116 and 118. The stops limit the spreading of the arms when the ram has been lowered sufficiently to move cams 50 and 52 out of engagement with the rollers.

Anvil assembly 22 is located on plate 12 on the lower side of circuit board slot 16 beneath the punch assembly 20. Assembly 22 includes an anvil bearing 120 in which anvil support 122 is slidably confined to permit movement toward and away from punch assembly 20. Anvil 124 is mounted on the upper surface of anvil support 122 so that when the support is extended, the upper end of the anvil engages circuit board 18 as illustrated in FIG. 13.

Movement of the anvil in bearing 120 is controlled by a toggle linkage 126 driven by the piston rod 128 of air cylinder 130. The lower link of the toggle linkage is pivoted at 132 to a support on plate 12, and the upper link of the assembly is pivoted at 134 to the bottom of anvil block 122. Air cylinder 130 is pivoted to plate 12 at 136. Extension of the toggle linkage is limited by adjustable stop 138 to control the distance the anvil 124 is moved into slot 16.

Incremental strip feed 24 is operated periodically to index the lead pin and ferrule of strip 28 to the cut-off position between slides 72 and 74 illustrated in FIG. 6 and 11. The strip is indexed from a reel or other supply toward punch assembly 20 in the direction of arrow 140 in FIG. 1. End 142 of carrier strip 32 is freed of pins 30 and ferrules 34, extends outwardly of opening 98, and may be led away from the apparatus by a guide tube or other means.

The strip feed includes a pair of elongate plates 144 and 146 which are offset from plate 12 by block 148 and extend toward the lower portion of punch assembly 20. The two plates 144 and 146 are fitted together to define an L-shaped feed path for strip 32 and connecting portions 36. A shallow recess for ferrules 34 is provided. The upper surface of block 148 is provided with a longitudinal recess 150 in which feed slide 152 is fitted. A feed finger 154 is pivotally mounted on the top of slide 152 and includes a pawl 156 which extends through a slot in plate 144 to engage the pilot holes 38 of strip 32 so as to feed the lead pin and ferrule pairs on the strip toward the cut-off position when the slide 152 is extended. Spring 158 biases feed finger 154 to hold the pawl in engagement with strip 32. Stop pin 160 extends upwardly from slide 152 between adjustable stops 162 and 164 so as to limit reciprocation of the slide within the recess. The end of the slide remote from feed finger 154 is attached to piston rod 166 of feed air cylinder 168 illustrated in FIG. 1.

Block 170 is mounted on the forward end of plate 144. Backup latch 172 is pivotally mounted on the top of the block 170 and is biased by spring 174 so that finger 176 which extends through an opening in plate 144 engages the pilot holes 38 in strip 32 to prevent retraction of the strip when feed finger 154 is retracted. Pivot block 178 is pivoted to the end of block 170 adjacent punch assembly 20 by means of pin 180. As illustrated in FIG. 15, a cover plate 182 is secured to block 178 to define a continuation of the feed path for strip 32.

The carrier strip 32 extends from the feed path defined by plates 144 and 146 across a short opening to the feed path defined by block 178 and cover plate 182. The axes of pins 30 are maintained approximately vertically parallel to each other by the flat surfaces defined by blocks 144 and 146 and by block 178 and cover plate 182. From the pivot block 178, carrier strip 32 extends into the feed path continuation formed by the space between slide 72 and cover plate 184 illustrated in FIG. 11.

When the carrier strip 28 is indexed to position the lead pin and ferrule between open jaws or slides 72 and 74, the lead pin 186 and ferrule 188 are positioned adjacent slide 72 with the ferrule 188 lightly engaging the shoulder 190 as illustrated in FIGS. 2 and 6. When the slide 72 is moved between the open and closed positions by cam 52 and arm 80, pivot block 178 is rotated slightly to lead strip 32 from the fixed feed path defined by blocks 144 and 146 and the portion of the feed path between the slide and cover plate 184. FIG. 5 illustrates slide 72 in an extended or closed position so that the pivot block feed path forms a linear extension of the fixed feed path, while FIG. 6 illustrates slide 72 in a retracted or open position with block 178 pivoted slightly to lead strip 32 to the slide.

Shoulder 192 on slide 74 faces shoulder 190 on slide 72 and is provided with a V-shaped recess 194, illustrated best in FIG. 6. When both slides 72 and 74 are extended and lead pin and ferrule 186 and 188 are positioned on shoulder 190, the two shoulders 190 and 192 are in abutment and the ferrule 188 is closely held in the recess against shoulder 190 so that the pin 186 is in accurate axial alignment with punch recess 56 and the upper end of the pin is free of the apparatus to permit the punch to lower and seat the pin in recess 56. This condition is illustrated in FIG. 11. When the pins are fed to the cut-off position they are generally oriented at a slight angle to the axis of the punch and must be brought into exact axial alignment by the slides 72 and 74.

The maximum width of the recess 194 is greater than the diameter of the ferrule 188 so that with closing of the two slides the recess first surrounds the ferrule and then centers the pin and ferrule in the desired location to correct any slight feeding error.

Figure 7:
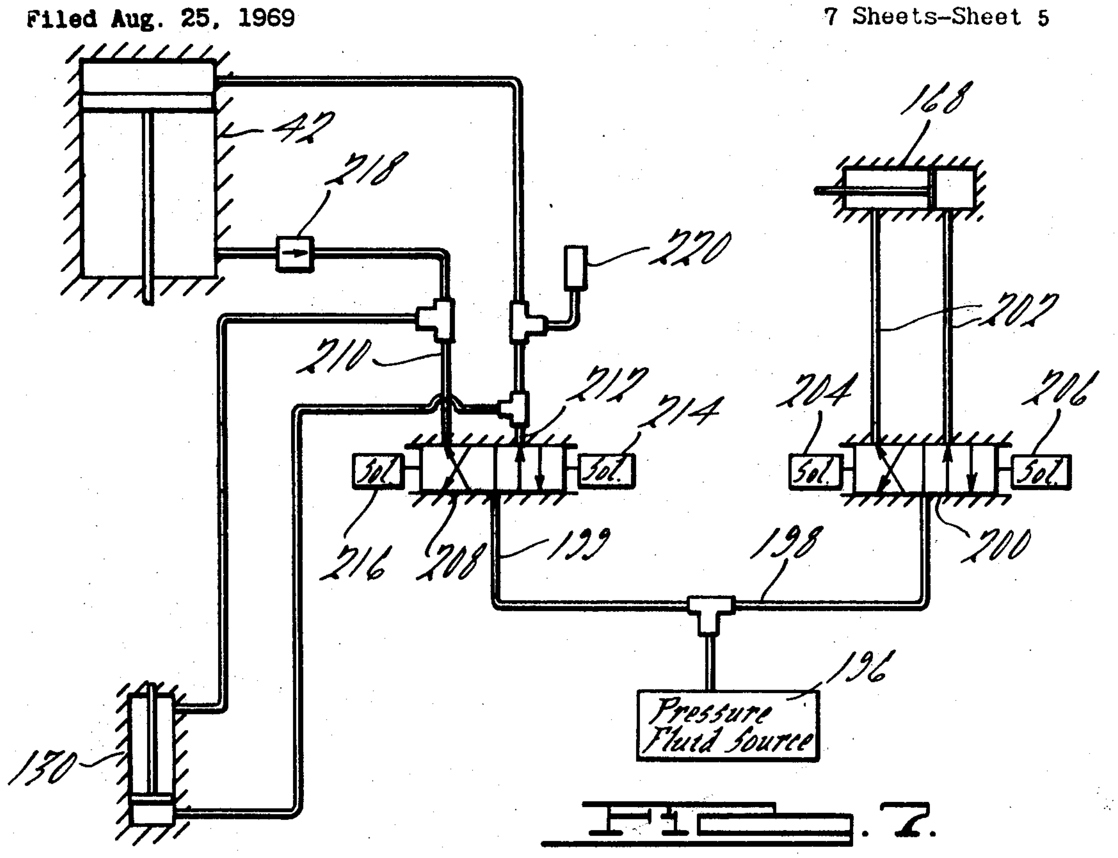
FIG. 7 is a schematic diagram of the pneumatic system of the apparatus.
Figure 8:
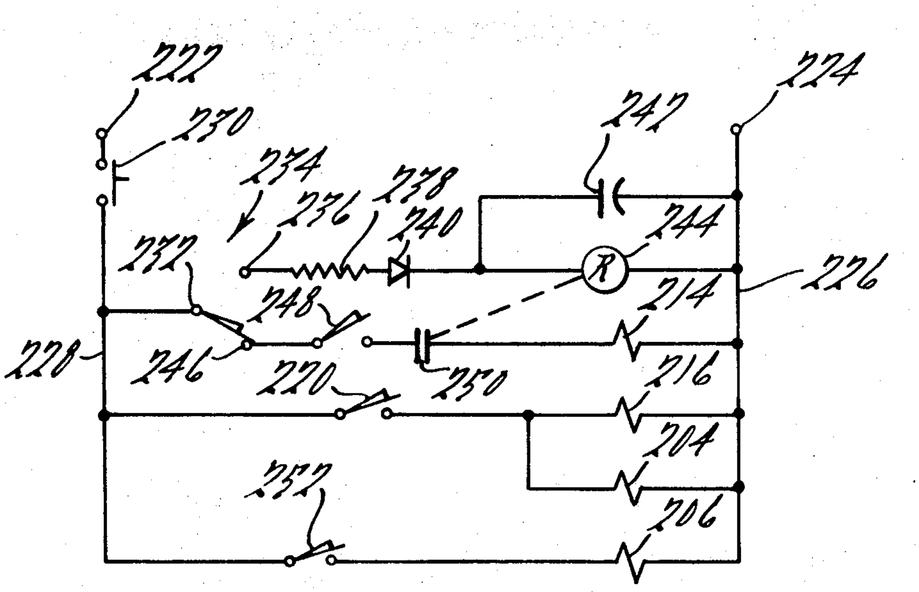

FIG. 7 illustrates the pneumatic circuitry of apparatus 10. Pressure fluid source 196, preferably a source of compressed air, is connected to feed air cylinder 168 through lead 198, double acting solenoid flow control valve 200, and connecting leads 202. Solenoids 204 and 206 control valve 200 so that when solenoid 206 is actuated the valve is shifted to extend cylinder 168, thereby feeding the lead pin and ferrule of strip 28 to the cut-off position between slides 72 and 74. Actuation of solenoid 204 shifts valve 200 to a position where feed air cylinder 168 is retracted to move the pawl on feed finger 154 on strip 32 to engage the next upstream pilot hole 38.

The pressure fluid source 196 is connected through lead 199 to a second double acting solenoid control valve 208. Leads 210 and 212 extend from valve 208 to punch air cylinder 42 and anvil air cylinder 130. Valve 208 is controlled by solenoids 214 and 216. When solenoid 214 is actuated, the valve is shifted to connect lead 212 to the pressure fluid source and to vent lead 210 so that the cylinders 42 and 130 are extended. Actuation of solenoid 216 vents lead 212 and connects lead 210 to the pressure fluid source so that the cylinders are retracted. A flow control 218 is located in the portion of lead 210 connected to air cylinder 42 to limit the rate of extension of the air cylinder. Normally open electrical pressure switch 220 is connected to lead 212 and is tripped by the pressure build-up following bottoming of air cylinder 42.

Figure 8:
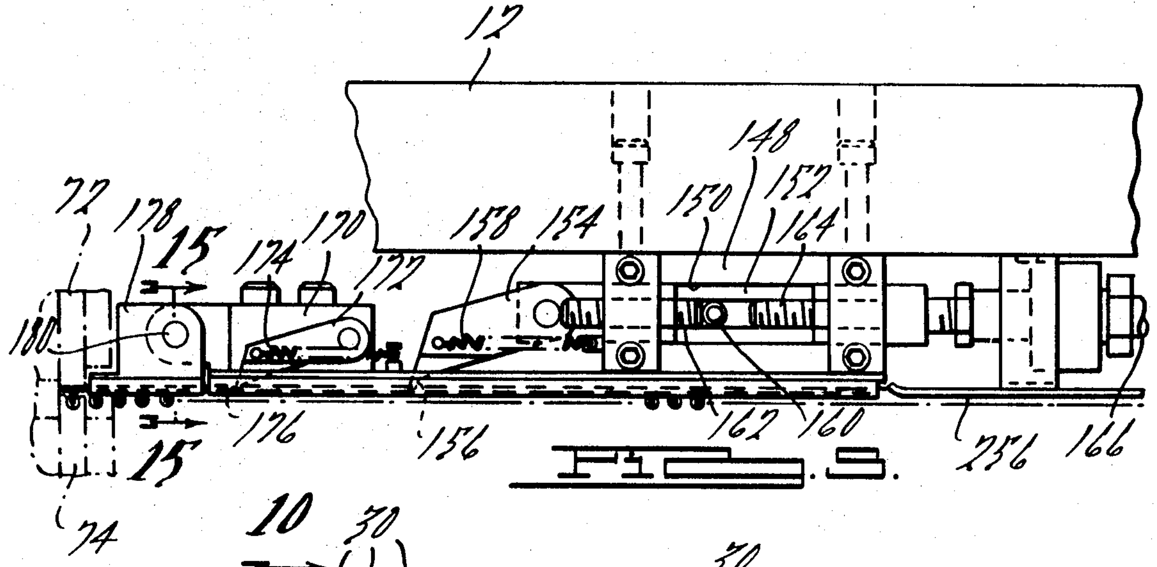
FIG. 8 is a schematic diagram of the electrical system of the apparatus.

FIG. 8 illustrates the electrical circuitry of the apparatus 10. Contacts 222 and 224 are connected to a conventional 110-volt AC current source. Lead 226 is connected directly to contact 224 and lead 228 is connected to contact 222 through on-off switch 230. A number of in-series circuits extend between leads 226 and 228. Contact 232 of double throw switch 234 is connected to lead 228. Contact 236 of switch 234 is connected to lead 226 through resistance 238, rectifier 240, and relay 244. Capacitor 242 is arranged in parallel with relay 244. The other contact 246 of switch 234 is connected to lead 226 through series oriented normally open microswitch 248, normally open relay contacts 250 of relay 244, and solenoid 214 of valve 208. Normally open pressure switch 220 is connected to lead 228 and to lead 226 through solenoid 216 of valve 208 and solenoid 204 of valve 200 which are in parallel. Normally open microswitch 252 is connected to lead 228 and to lead 226 through solenoid 206 of valve 200.

As illustrated in FIG. 1, normally open microswitch 248 is located adjacent feed air cylinder 168 and is closed by stop 254 on the air cylinder piston rod when the air cylinder is fully extended to position the lead pin 186 and ferrule 188 between slides 72 and 74. Normally open microswitch 252 is mounted on plate 12 above ram block 46 so that when air cylinder 42 is fully retracted to position the block in the position illustrated in FIG. 2, cam 52 engages the trigger of the switch to close the same. As illustrated in FIGS. 1 and 5, a guard plate 256 is mounted outside of feed air cylinder 168 to assure that the pin and ferrule strip 28 is fed into the strip feed with the pins in approximate vertical orientation.

OPERATION OF THE APPARATUS

FIGS. 1 and 2 illustrate apparatus 10 in the start position. Ram air cylinder 42 is fully retracted so that the ram block 46 is positioned adjacent switch 252 and the trigger of the switch engages cam 52 so that the switch is closed. Rollers 86 and 88 on the slide arms 78 and 80 engage rise surfaces 258 and 260 of cams 50 and 52. Cams 50 and 52 are provided with flat dwell surfaces 262 and 264 and with fall surfaces 266 and 268.

In the start position, feed air cylinder 168 is extended so that pin 160 abuts stop 162. Stop 254 engages the trigger of switch 248 to close the same. With air cylinder 168 extended, lead pin and ferrule 186, 188 are positioned on slide shoulder 190 opposite the ferrule receiving recess 194 in shoulder 192, as illustrated in FIG. 6. Both slides 72 and 74 are partially retracted so that arms 78 and 80 do not engage stops 116 and 118. As indicated in FIG. 2, pin 186 is located to the right of the pin receiving slot in punch 54.

Anvil air cylinder 130 is retracted as in FIG. 1 to collapse toggle linkage 126 so that the anvil 124 is withdrawn within anvil bearing 120. At the start of the cycle of operation, switch 234 is in the position illustrated in FIG. 8 where contacts 232 and 246 are connected.

To initiate the cycle of operation, the operator closes on-off switch 230 and moves the circuit board support 26 within slot 16 to position a ferrule receiving hole 270 into axial alignment with punch 54 and anvil 124. Support 26 is located at a level within the slot 16 so that when the anvil 124 is extended, it just engages the bottom of circuit board 18.

When circuit board hole 270 is properly aligned, switch 234 is shifted to connect contact 232 with contact 236 so that a direct current flows through resistor 238, rectifier 240, and relay 244. Energization of the relay 244 closes normally open contacts 250. At this time capacitor 242 is charged. After the capacitor is charged, switch 234 is shifted back to the position shown in FIG. 8 where contacts 232 and 246 are joined.

Shifting of switch 234 back to its normal position causes current to flow through closed microswitch 248 and closed relay contacts 250 to energize valve solenoid 214. The contacts 250 remain closed until capacitor 242 discharges through relay 244. Solenoid 214 shifts valve 208 so that line 212 is connected to the pressure fluid source 196, line 210 is vented, and cylinders 42 and 132 are extended. Extension of cylinder 130 extends toggle linkage 126 to raise the anvil 124 so that the upper end 272 of the anvil engages the bottom surface of circuit board 18 as illustrated in FIG. 13.

Extension of ram air cylinder 42 moves punch 54 and cams 50 and 52 down toward lead pin and ferrule 186, 188. As the punch starts to move down and before it engages pin 186, rollers 86 and 88 are moved up cam surfaces 258 and 260 to rest on the cam dwell surfaces 162 and 164. This position is illustrated in FIG. 11. Movement of the rollers from the rise surfaces 258 and 260 to the dwell surfaces 262 and 264 pivots slide arms 78 and 80 about bearings 82 and 84 to move slides 72 and 74 toward each other so that ferrule 188 is clamped in recess 194 between shoulders 190 and 192 in axial alignment with the punch and anvil.

When the lead pin and ferrule 186, 188 are fed to the cut-off position between slides 72 and 74, there is no assurance that the longitudinal axis of the pin will be in alignment with that of the punch, particularly since the ends of the pin are free. By clamping the ferrule between shoulders 192 and 194, the axis of the pin is brought into exact alignment with the axis of the punch to permit lowering of the punch around the pin. Recess 194 is sufficiently wide so that when shoulder 192 is moved toward the ferrule, the recess surrounds the ferrule and corrects any slight lateral error in positioning of the pin and ferrule on the flat surface of shoulder 190.

As air cylinder 42 continues to lower the punch 54, rollers 86 and 88 continue along dwell surfaces 262 and 264 so that the lead pin and ferrule 186, 188 remain clamped between the slides in alignment with the punch. While pin 186 is held in this position and the rollers are on the dwell surfaces of the cams, punch 54 is lowered over the upper end of the pin 186 so that the pin extends into the pin receiving recess 56 in the punch. Continued lowering of the punch moves the spring 60 past the beveled upper end of the pin so as to hold the pin in the punch.

After the punch has lowered sufficiently so that spring 60 holds the pin in place, roller 86 falls from dwell surface 262 onto surface 266 so that slide 74 is withdrawn and shoulder 192 and slide 74 are moved to the right out of the downward path of the punch. At this time roller 88 is still on dwell surface 264 so that slide 72 is extended. The position of the punch and slides at this time is shown in FIG. 13.

Continued downward movement of the punch 54 moves cutting edge 68 on the punch past cutting edge 70 on shoulder 190 to sever ferrule 188 from strip 32. Immediately following severing of the ferrule from the carrier strip, roller 88 falls from dwell surface 264 to surface 266 so that slide 72 and strip 28 are withdrawn to the left from the path of the punch and block 178 is pivoted to the position of FIG. 6.

Further lowering of the punch 54 with the freed pin and ferrule 186, 188 carried thereby moves rollers 86 and 88 off of cams 50 and 52 so that arms 78 and 80 are held against stops 116 and 118 by springs 112 and 114 and the slides are fully retracted. As the air cylinder 42 approaches the fully extended position, the lower end of pin 186 is moved through circuit board hole 270 and a pin receiving hole 274 in anvil 124. Just prior to bottoming of the air cylinder, ferrule 188 is lowered into hole 270. The lower end 276 of the ferrule may be beveled as indicated in FIG. 13 to facilitate movement of the ferrule into the circuit board hole.

As cylinder 42 bottoms, the lower end 276 of the ferrule engages recessed upper surfaces 278 of anvil 124. With the ferrule positioned in hole 270 and engaging the anvil, the final slight downward movement of punch 54 sandwiches the ferrule between the lower punch surface 76 and anvil surface 278 so that the ferrule is deformed as illustrated in FIG. 14. Deformation of the ferrule secures the pin and ferrule to the circuit board. While FIG. 14 illustrates one way in which the ferrule may be deformed to secure the pin to the board, it is obvious that the ferrule may be deformed in other ways to secure the pin to the board.

The rate of descent of the punch 54 is slowed by flow control 218 to assure that anvil 124 is fully extended before the punch is fully extended. The diameter and stroke of air cylinder 130 are smaller than the diameter and stroke of air cylinder 42 so as to assure that the anvil is extended first. The flow control and size of air cylinder 42 limit the downward speed of the punch so as to prevent overstressing of the punch when the pin and ferrule are severed from strip 32 and are staked to the circuit board.

When air cylinder 42 bottoms, the pressure in line 212 increases to close normally open pressure switch 220 so that solenoids 216 and 204 are energized. Energization of solenoid 216 shifts valve 208 so that air cylinders 42 and 130 retract to lower anvil 124 and raise punch 54. During the return stroke of the punch, cams 50 and 52 are moved past rollers 86 and 88 to move slides 72 and 74 toward and away from each other. When the air cylinder 42 is fully retracted, cam 52 engages the trigger of normally open microswitch 252 to close the switch. A stop prevents further retraction of cylinder 42.

Energization of solenoid 204 shifts valve 200 to retract feed air cylinder 168 so that the pawl 156 of feed finger 154 is moved to engage the next upstream pilot hole 38 on strip 32.

With the closing of microswitch 252, solenoid 206 is energized to reshift valve 200 and thereby extend the feed air cylinder 168 to index the lead pin and ferrule on the strip to the cut-off position between shoulders 190 and 192. When the air cylinder 168 is fully extended so that the lead pin and ferrule are in the cut-off position, microswitch 248 is closed. If switch 248 is not closed it will be impossible for solenoid 214 to be energized during the next cycle of operation of the applicator. Thus if the feeding of the carrier strip is not completed and switch 248 is not closed, it will be impossible to lower air cylinder 42. In this way jams are prevented due to lowering of the punch when the lead pin and ferrule are not in proper position to be clamped by slides 72 and 74.

Extension of air cylinder 168 to feed the lead pin and ferrule to the work position ends the cyle of operation of the apparatus. The operation will then position a new circuit board hole in alignment with the punch and anvil and reshift switch 234 to initiate the next cycle of operation.

By clamping lead pin and ferrule 186, 188 accurately in alignment with the pin receiving hole 56, 58 in the punch it is possible to reduce the cross section of the punch to a minimum size. Thus the applicator 10 enables circuit board pins to be mounted on a board in very close proximity to each other so that a maximum pin density may be achieved. Because the punch 54 holds pin 186 in alignment with the hole 274 in anvil 124, the cross section of the anvil also may be reduced to a minimum.

The operation of the apparatus 10 is rapid and reliable. While the apparatus is used to physically secure a wire wrap pin to a circuit board, it is obvious that in some applications it may be desirable to solder dip the board in order to form a solder connection between printed circuitry on the board and the pins attached thereto.

The apparatus disclosed herein is intended for use in applying square wire wrap or disconnect pins to circuit boards; however, it is not intended that the invention be limited by the form of the pin applied to the board or to a pin with a surrounding ferrule. Likewise the invention is not limited by the type of substrate to which the pin is attached. While in the disclosure pins are attached to a circuit board, the invention could be used to attach pins to ceramic plates or other substrates.

While I have illustrated and described a preferred embodiment of my invention, it is understood that this is capable of modification, and I therefore do not wish to be limited to the precise details set forth.

What I claim as my invention is:

1. Apparatus for attaching a pin-like contact to a circuit board comprising a support, a punch assembly on said support, and feed means on said support for periodically positioning the lead pin of a series of pins in a pick up position within said assembly, said punch assembly including a ram confined within said assembly for movement toward and away from said pick up position, an elongated punch extending from said ram toward said position and having a contact receiving axial opening in the free end thereof for receiving the contact, means for moving said ram toward said pick up position, a cam on one side of said ram having a dwell surface, a pair of contact orienting jaws located to either side of said pick up position, one of said jaws being confined within said assembly to permit movement toward and away from the other jaw so as to engage and hold said contact in axial alignment with said opening when adjacent said other jaw, an arm extending along the side of said assembly and pivoted thereto, a cam follower on said arm engageable with said cam upon movement of the ram toward said position, said arm being connected to said one jaw so that as said ram is moved toward said position said cam is moved past said follower to move said one jaw toward the other jaw when the follower moves to the dwell surface so as to hold said one jaw adjacent the other jaw while the follower is on said dwell surface and to release said one jaw when the follower moves from said dwell surface, said cam follower being located at a distance from the end of the contact adjacent the punch greater than the distance from the end of said punch when retracted to the beginning of said dwell surface, the axial extent of said dwell surface being greater than the axial distance between the end of said punch and such end of said contact when said follower first engages said dwell surface so that movement of the ram toward the pick up position aligns said contact relative to said opening prior to movement of the punch to position the contact within said opening, and further movement of the ram releases said contact from between said jaws and carries the contact from the assembly and into engagement with a circuit board for attachment thereto.

2. Apparatus as in claim 1 including an anvil assembly spaced from said punch assembly on the side of said pick up position away from said ram, said anvil assembly including an extendable anvil axially aligned with said punch and means for extending said anvil to engage the circuit board, the free end of said anvil having an opening axially aligned with said punch opening whereby movement of the punch to engage a circuit board and insert the pin carried thereby seats the free end of the pin within said anvil opening.

3. Apparatus as in claim 1 wherein said feed means includes a feed track for confining a carrier strip with a number of contact pins mounted thereon, said feed track extending into said one jaw so that the lead contact pin is positioned adjacent said jaw, and means for moving said strip along said track, a portion of said feed track adjacent said jaw being pivotally mounted to said apparatus to permit the strip to be led to said one jaw as such jaw is moved toward and way from the other jaw.

4. Apparatus as in claim 1 wherein said punch carries spring means normally extending into said opening so as to resiliently hold the contact within the opening.

5. Apparatus as in claim 1 wherein said arm is pivoted to said assembly between said jaw and said follower.

6. Apparatus for attaching a contact to a circuit board comprising a support, a punch assembly on said support and feed means on said support for periodically positioning the lead contact of a series of contacts in a pick up position within said assembly, said punch assembly including a ram having an elongate punch extending from the ram toward said position, said punch having contact holding means at the free end thereof, means for moving the ram toward said position, contact orienting means adjacent said position operable to engage the contact and align the same with said holding means, and actuation means operable to actuate said orienting means prior to engagement of the contact and said holding means and to release said orienting means following engagement of the contact and said holding means, said ram drive means having a stroke sufficient to move said punch past said pick up position and toward a circuit board to attach the contact to the circuit board.

7. Apparatus as in claim 6 wherein said orienting means includes a pair of closable jaws having opposed jaw faces, and a contact orienting recess is formed in one jaw face, said jaws cooperable when closed to hold such lead contact in such recess in alignment with said holding means.

8. Apparatus as in claim 6 wherein said orienting means includes a pair of jaws closable about the contact, and said actuation means includes a cam carried by said ram and having an extended dwell surface, an elongate arm pivoted to said assembly, a cam follower on said arm engageable with said cam, said arm being secured to one of said jaws so as to move said jaw toward the other said jaw when said cam follower is moved to said cam dwell surface, the extent of said dwell surface in the direction of travel of the ram being greater than the spacing between said holding means and the contact when said cam follower first engages said dwell surface during movement of the ram toward the contact whereby said jaws close and hold such contact in alignment with said holding means prior to and during engagement of the contact and the holding means.

9. Apparatus as in claim 8 wherein said feed means includes a feed track for a contact carrier strip and means for indexing the strip along said track toward said one jaw, said one jaw includes a continuation of said feed track from said feed means, a portion of said track adjacent said one jaw being pivoted to said assembly to lead the carrier strip to said one jaw during movement of such jaw by said actuation means.

10. Apparatus as in claim 8 wherein the pivot connection between said arm and said assembly is located between said cam follower and said one jaw.

11. Apparatus as in claim 8 wherein said feed means includes a contact strip feed path and means for indexing contact strip along said path, said path extending into the other of said jaws so that actuation of said feed means positions the lead contact adjacent said jaw.

12. Apparatus as in claim 8 wherein said actuation means also includes a second cam carried by said ram and having an extended dwell surface, a second arm pivoted to said assembly, a second cam follower on such arm engageable with said second cam, said second arm being secured to the other of said jaws so as to move such jaw toward said one jaw when said second cam follower is moved to the dwell surface of the second cam, the extent of the dwell surface of the second cam in the direction of travel of the ram being greater than the spacing between said holding means and such contact when said second cam follower first engages such dwell surface during movement of the ram toward such contact, whereby both said jaws are moved together to hold such contact in an oriented position relative to said holding means during engagement of the contact and the holding means.

13. Apparatus as in claim 12 wherein said feed means includes a contact strip feed path extending to said one jaw and means for indexing the strip toward such jaw, and said assembly includes a pair of cutting edges formed on such jaw and on the exposed end of said punch for severing the lead contact from the contact strip when said ram is lowered to bring said cutting edges together, the extent of the dwell surface of said first cam being slightly greater than the distance moved by the ram from the time the first follower engages such surface to the time when said edges sever the contact from the strip and the extent of the dwell surface of said second cam being approximately equal to the distance moved by said ram from the time said second cam engages the dwell surface of said second cam to the time when said holding means engages the contact whereby movement of the ram toward the lead contact clamps the contact between said jaws, moves the holding means into engagement with the contact, releases said second jaw, severs the hold contact from the carrier strip, and then releases said first jaw.

References Cited

UNITED STATES PATENTS 2,765,468 10/1956 Coofes et al. ------ 29—203DT
2,768,763 10/1956 Meilstrup ---------- 29—211D GRANVILLE Y. CUSTER, Jr., Primary Examiner U.S. Cl. X.R.

29—211D